US006677034B1

(12) United States Patent
Hooley et al.

(10) Patent No.: US 6,677,034 B1
(45) Date of Patent: Jan. 13, 2004

(54) AEROGELS, PIEZOELECTRIC DEVICES, AND USES THEREFOR

(75) Inventors: Anthony Hooley, Cambridge (GB); David Henry Pearce, Birmingham (GB); Luc Forest, Bordeaux (FR)

(73) Assignee: 1 . . . Limited, Cambridge (GB)

( * ) Notice: Subject to any disclaimer, the term of this patent is extended or adjusted under 35 U.S.C. 154(b) by 0 days.

(21) Appl. No.: 09/508,009

(22) PCT Filed: Sep. 4, 1998

(86) PCT No.: PCT/GB98/02675

§ 371 (c)(1),
(2), (4) Date: Mar. 6, 2000

(87) PCT Pub. No.: WO99/13681

PCT Pub. Date: Mar. 18, 1999

(30) Foreign Application Priority Data

| Sep. 5, 1997 | (GB) | 9718785 |
| Mar. 11, 1998 | (GB) | 9805053 |
| Mar. 19, 1998 | (GB) | 9805735 |

(51) Int. Cl.$^7$ ............................................. B32B 5/16
(52) U.S. Cl. ............ 428/323; 428/354; 428/402; 181/286; 181/293; 102/303; 89/36.02
(58) Field of Search .................. 428/354, 323, 428/402; 89/36.02; 102/303; 181/286, 293

(56) References Cited

U.S. PATENT DOCUMENTS

| 4,429,068 A | 1/1984 | Nakahira | 524/302 |
| 4,868,447 A | 9/1989 | Lee et al. | 310/328 |
| 4,954,327 A | 9/1990 | Blount | 423/338 |
| 5,381,149 A | 1/1995 | Dougherty et al. | 342/1 |
| 5,394,786 A * | 3/1995 | Gettle et al. | 86/50 |
| 5,485,053 A | 1/1996 | Baz | 310/326 |
| 5,526,601 A | 6/1996 | Onuma et al. | 43/17 |
| 5,550,338 A | 8/1996 | Hielscher | 181/290 |
| 5,613,188 A | 3/1997 | Piech et al. | 428/547 |
| 5,655,538 A | 8/1997 | Lorraine et al. | 128/662.03 |
| 5,656,195 A * | 8/1997 | Mielke et al. | 252/62 |
| 5,748,758 A | 5/1998 | Menasco, Jr. et al. | 381/176 |
| 5,786,059 A | 7/1998 | Frank et al. | 442/68 |

FOREIGN PATENT DOCUMENTS

| DE | 19814697 | 10/1999 |
| EP | 0 111 408 | 6/1984 |
| GB | 0758631 | 10/1956 |
| GB | 2284298 | 5/1995 |
| JP | 4-295286 | 10/1992 |
| JP | 4-353463 | 12/1992 |
| JP | 5-050606 | 3/1993 |
| JP | 5-055659 | 3/1993 |
| WO | WO 97/38351 | 10/1997 |
| WO | WO 98/09339 | 3/1998 |

OTHER PUBLICATIONS

English language abstract for JP 1–157473, Jun. 20, 1989.
English language abstract for JP 3–108997, May 9, 1991.
Pierre, A. C.: "Porous Sol–Gel Ceramics", Ceramics International, vol. 23, No. 3, 1997, pp. 229–238.
Hrubesh, L.W. and Poco, J.F.: "Thin Aerogel Films for Optical, Thermal, Acoustic and Electronic Applications", Journal of Non–Crystalline Solids 188 (1995), pp. 46–53.

* cited by examiner

*Primary Examiner*—Leszek Kiliman
(74) *Attorney, Agent, or Firm*—Synnestvedt & Lechner LLP

(57) ABSTRACT

In its first aspect the invention provides an electromechanical acoustic transducer (5) which is resistively terminated at the rear with a closely-coupled sound absorber (7) made from an aerogel with good acoustic absorption at low frequencies. The invention also provides an aerogel suitable for this use and which is a conglomerate of small particles packed so that there are spaces left therebetween to allow the passage of sound. Moreover, the invention provides an aerogel suitable for this use and comprised of multiple layers (17a etc.) of materials of graded properties, or comprised of material of continuously varying properties throughout the thickness of the absorbing structure, in the principal direction of sound from the source.

35 Claims, 5 Drawing Sheets

17

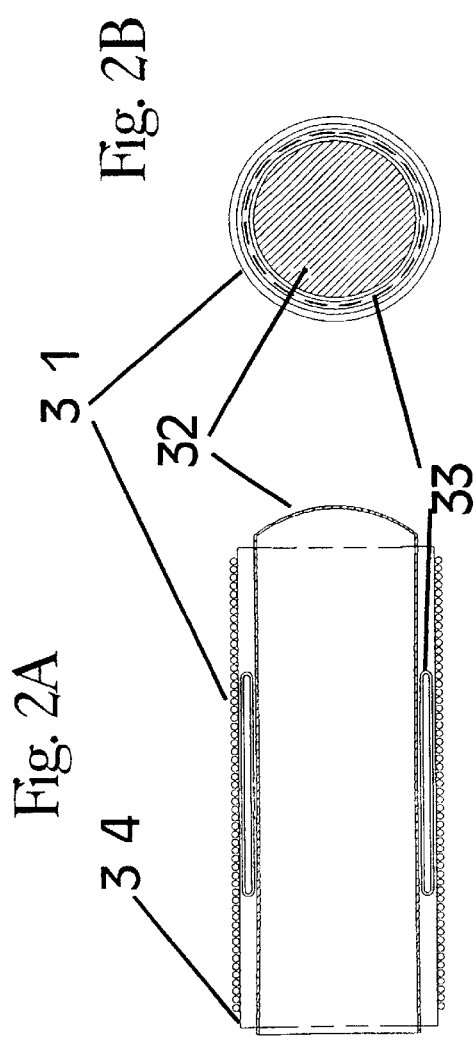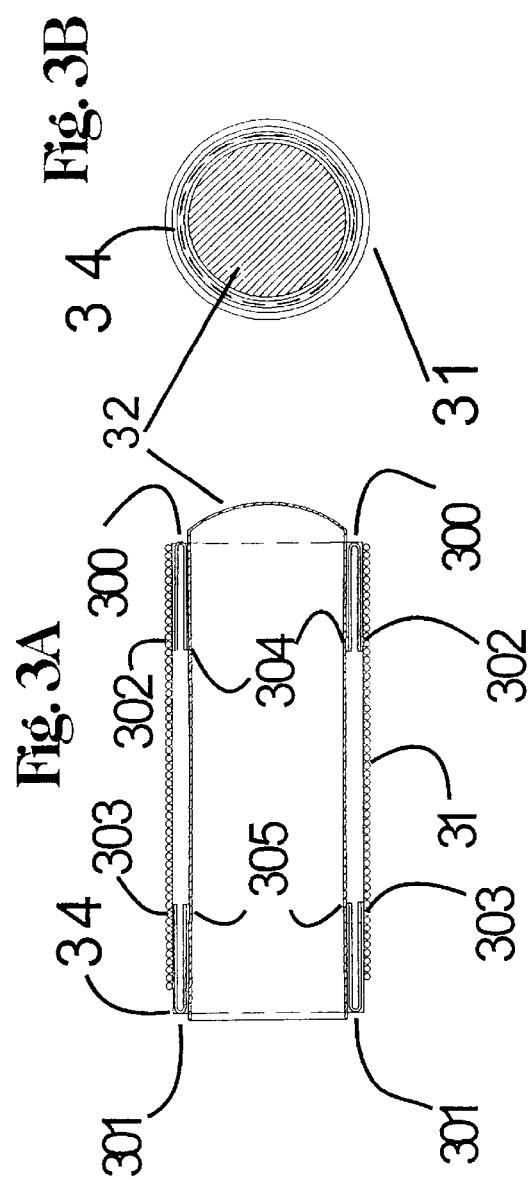

AEROGELS, PIEZOELECTRIC DEVICES, AND USES THEREFOR

This invention relates to aerogels, piezoelectric devices, and uses therefor. More particularly, the invention relates to novel constructions made from aerogels, to the use of aerogels as resistive terminations in acoustic transducers, to the use of aerogels as translators in electric motors and transducers, to the use of aerogels as pistons in acoustic transducers, to the use of aerogels as transducer elements in visual display units, and to novel constructions of piezoelectric devices, some with integral positioning and control mechanisms, some for use as print-head devices, and some for use as electromechanical drivers.

AEROGELS AND THEIR USES

A conventional gel is a mixture of a rubbery solid substance, such as gelatine, which forms a continuous phase within which is dispersed, and trapped, a liquid, such as water. The result is a jelly (or jello). An aerogel might be described as a solid/gas analogue of a gel; it is a substantially solid porous (vesicular) material in which some suitable solid substance forms a continuous phase holding within itself, in pores rather like open-cell "bubbles" (vesicles), a gas (typically air). Pumice, which is a fine solid foam of air in solidified lava (technically it is a "vesicular glass") usually having a density less than one (so it floats in water), is a natural material similar in some ways to an aerogel, though the pores in the latter tend to be of random form and disposition rather then "bubble"-like.

Many synthetic, man-made, aerogels are known. Most are based on silica (silicon dioxide), but there are many made from other materials, such as metal oxides, and a variety of plastics (like polyurethanes) and natural and synthetic rubbers. They are commonly manufactured by making a gel of the solid and some suitable liquid (such as water), and then removing the liquid in such a way that the surface tension forces of the liquid do not collapse the gel structure, as usually happens if a gel is allowed to dry out without special precautions. Typically, this involves displacing the gel's liquid component with alcohol, then displacing the alcohol in turn with liquid $CO_2$. The gel is then subjected to a temperature and pressure high enough to take the $CO_2$ into its super-critical state (when it is effectively neither liquid nor gas), at which point is may be vented from the gel leaving behind the solid phase. The absence of surface-tension forces in the super-critical fluid ensures that the solid phase is not collapsed during the venting stage; thus, this leaves the solid phase of the gel largely intact and interconnected, and in a highly porous state—an aerogel.

In general, aerogels are highly porous. They have pore sizes typically in the range 5–50 nanometers, and porosities in the range 50–99.9%.

Depending on what they're made from, and exactly how they're made, so aerogels can have a wide range of physical properties. They can be light (like that silica variety available as SP-50 from Matsushita, which weighs somewhat less than 185 g/l while the silica from which it is formed is itself much heavier, at about 2.2 kg/l) or extremely light (like the silica material prepared by Larry Husbresh, of the Lawerence Livermore National Laboratory, USA, in the late 1980s, which weighs about 3 g/l, or only about three times the density of air at NTP, despite the silica from which it is made weighing as much as 2.2 kg/l). They can have large or small cells (vesicles, or pores)—ranging from a few hundred nanometers down to as little as a few nanometers in average diameter. They can be magnetic (or, at least, easily magnetised or affected by a magnet), such as the silica aerogel/transition metal composites made by the Microstructured Materials group at the Berkley Lab (USA), or they can be substantially non-magnetic, as is the case with most others. They can be opaque (to visible light) or even transparent (such as Matsushita's SP-50).

Many aerogels are described in some detail, with their methods of preparation, in Aerogels 5, Proceedings of the Fifth International Symposium on Aerogels, (ISA-5), Montpellier, France, 8–10 September 1997: Editors J Phalippou, R Vacher (North Holland Elsevier, 1998). Specific aerials there described include those mentioned above (Matsushita at pages 369, Hoeschst at page 24), together with (on page 36) an ICI polyurethane/polyisocyanate aerogel in both monolithic and particle form with a density of 80–100 kg/m$^3$ and a pore size of 11–18 nanometers—

AEROGELS AS SOUND ABSORBERS

One aspect of this invention relates to the use of aerogels as substantially resistive terminations in acoustic transducers.

An acoustic transducer—as typified by either a loudspeaker or a microphone—is a device that converts electrical energy into audible sound energy (or, in the case of a microphone, vice versa). They are generally electromechanical devices; in a loudspeaker, for example, a diaphragm is driven by a "translator"—a moving coil or a magnet itself driven by an applied magnetic field—in a manner dependent on the electrical signal to be transduced, and the result is that the diaphragm causes air pressure changes that reproduce the sound represented by the electrical signal.

Loudspeakers—transducers for acoustic use like this—are most commonly of the light-weight moving-coil design, and can be made to operate up to and beyond the limit of human hearing (20,000 Hz or more). However, at the low end of the range, e.g. below 100 Hz, there arise acoustic problems unrelated to the electromechanical nature of the transducer, which problems are due to the dipole nature of any simple electroacoustic transducer. Thus, because the sound radiation—the air pressure waves—from the rear of the transducer is nominally of equal amplitude but in antiphase to that from the front of the transducer, then—and this is especially a problem at low frequencies, where the wavelengths involved are on a par with, or larger than, the dimensions of the transducer—the essentially omnidirectional rear radiation destructively interferes with the front radiation, causing a significant loss of useful output.

One standard solution to this problem is to mount the transducer in the front wall of a closed box, thus stopping the rear radiation from escaping from the box, and thus preventing the destructive interference. Unfortunately, conveniently-sized (generally, small) boxes have a volume that is only a relatively small multiple of the volume displaced by motion of the transducer, and thus with such a closed box the air within, having nowhere to escape, becomes significantly compressed and decompressed as the transducer moves back and forth a significant distance (as it must at low frequencies if it is to produce any real acoustic power). The net effect is that the closed volume of trapped air acts as a capacitative load on the transducer, and reduces the stroke at high displacements for a given input power to the transducer. This in turn produces non-linearity and distortion in the output sound.

An alternative way of looking at the problem is to consider the dimensions of the box. Where the internal dimensions of the box are small compared to a wavelength of sound from the rear of the transducer, the box, being rigid, reflects the sound back to the transducer. This reflected sound is largely in-phase with the rear-radiated sound, and this therefore loads the transducer so as greatly to reduce its amplitude of motion (compared to that without the box), thus reducing the useful sound output from the front of the transducer.

Additionally, closed boxes have relatively strong resonances, and much effort has to be expended to reduce these resonances in practical loudspeakers.

A variation of the closed box approach is to fit a bass-reflex port—that is, essentially an acoustic tuned circuit that aims to reverse the phase of the rear-radiation over a narrow frequency band before it reaches the front of the transducer. This solution is used in some practical loudspeakers, but has drawbacks due at least in part to its resonance-related basis, and is known to cause severe phase distortion. An alternative answer to the rear-radiation problem is the so-called infinite-baffle—essentially simply a large flat panel (through which is mounted the transducer) the dimensions of which are comparable to or larger than a wavelength of the lowest frequency of sound to be reproduced. Here, the rear radiation has such a long path to traverse (around the edge of the panel) before it can interfere with the front radiation that it can no longer significantly interfere destructively. However, the flat panel answer is impractical at low frequencies as the wavelength of sound in air at 20 Hz is close to 50 feet (about 15 meters), and obviously a baffle of this size is awkward and unrealistic for most purposes.

In its first aspect, the invention proposes a possible solution to this problem of electromechanical acoustic transducers suffering from rear radiation destructively cancelling the front radiation, particularly at low frequencies where the path length from front to rear is comparable to or less than a wavelength of sound in air. More specifically, the invention suggests that the transducer be resistively terminated at the rear with a closely-coupled sound absorber (in a manner analogous to the termination of an electrical transmission line with a matched electrical resistance to avoid reflections, terminating the rear of the transducer with an approximately matched acoustic resistance can be arranged to cause a high percentage of its rear radiation to be absorbed, and thus unavailable to interfere destructively with the front radiation). More specifically still, the invention suggests that the material used as the acoustic resistance be an aerogel of a form known to have good acoustic absorption at low frequencies.

In its first aspect, therefore, the invention provides an electromechanical acoustic transducer which is resistively terminated at the rear with a closely-coupled sound absorber made from an aerogel with good acoustic absorption at low frequencies.

The invention provides in this aspect an electromechanical acoustic transducer. This transducer may be of any required form, and for any purpose; a typical transducer for use as a hi-fi loudspeaker is of the moving-coil type such as that sold by Audax of France under the name ATO80MO.

The transducer of the invention is resistively terminated at the rear with a closely-coupled sound absorber (by "closely-coupled" is meant that substantially all of the sound emitted by the [rear of] the transducer is caused to be directed towards and into the sound absorber). In general resistive termination is accomplished in practice merely by placing behind the transducer, and in the path of any sound radiation emanating from the transducer's rear, a pad, buffer, cushion, wad or block of the requisite sound absorbing aerogel material. Preferably, however, the transducer is placed at and across the front of a suitably-shaped box open at the rear, and the rear is then closed with the block of aerogel sound absorber.

The aerogel naturally is one with good acoustic absorption at low frequencies. Aerogels made from silica, polyurethanes and rubbers have particularly good intrinsic sound absorbing properties. The pore size in the aerogel can be made as small as several nanometers, much smaller than the mean free path of oxygen and nitrogen molecules in the air at NTP, which ensures that every molecule in the air driven back and forth by the transducer will, in passing through a plug of aerogel of centimeter dimensions, make a very large number of collisions with the material of the aerogel, and thus exchange its energy with the material. Internal surface areas in the areogel can be as high as 1,000 $m^2/g$ of material, this providing potentially high sound absorption. By appropriate choice of the material from which the areogel is made, and the mean pore size within the material, it is possible to produce acoustic resistances of a wide range of values with very high sound absorption in small quantities of material, thus making the material ideal for use in the invention to reduce of nearly eliminate the rear radiation, without significant back pressure effects on the transducer translator, thus producing little or no impairment to the linearity of the transducer. It is only necessary to absorb half the acoustic output of the rear of a transducer to reduce the effects of destructive interference at the front of the transducer to a mere 3 dB drop in response: in practice significantly more than half the output can be absorption in the way described, thus eliminating the need for a closed box or large baffle and allowing a compact wide range acoustic transducer of low weight and wide flat frequency response.

Typical instances of usable aerogel materials are Matsushita's SP-30 (in 2–3 mm bead form), SP-15 (also in 2–3 mm bead form) and Hoechst's HIL2 (in particle form).

The use of an aerogel sound absorber as described above may be enhanced by the addition of a coupling and filling gas or gas mixture trapped by an outer gas-impermeable but acoustically-transparent membrane, the gas or gases being chosen so as to optimize the matching of the acoustic resistance of the absorber to the radiation resistance of the transducer, or instead, or as well as, to optimize the absorption of the sound from the rear of the transducer.

For example, neon has a viscosity about twice that of air of NTP, while hydrogen and helium have lower viscosities than air. Sulphur hexafluoride has a sound speed of only 133 m/s, almost 3 times lower than air at NTP, whilst Freon 113 has an even lower sound speed of 124 m/s. If, then, the space between the rear of the transducer and the outside air, including the space occupied by the aerogel sound absorber, is partitioned off with a gas-impermeable membrane that is also acoustically transparent, and is filled with a suitable mixture of gases other than air, additional beneficial impedance matching and absorption enhancements may be obtained, allowing more efficient operation of the transducer, and more absorption in the same volume or a smaller volume of absorber to achieve the same level of performance.

If, for instance, helium is used, then firstly the transducer dissipates less sound energy into the helium because the transducer/gas impedance mismatch is increased, and secondly, because the helium is less viscous than air, and so flows more readily than air through the pores of the aerogel and other absorptive materials, it increases the sound absorption in those absorbers. So, for two quite separate reasons the total amount of sound energy emanating from the rear of the transducer and absorber combined is reduced when using helium as the gas.

PREFERRED AND NOVEL AEROGEL STRUCTURES

The invention suggests that the transducer be resistively terminated at the rear with a closely-coupled sound absorber and that the material used as the acoustic resistance be an aerogel of a form known to have good acoustic absorption at low frequencies. However, the fabrication of a practical acoustic matched terminator (or absorber) as described above is not easy, for the two prime physical characteristics important—the terminator's impedance and its absorption properties—tend to be the result of mutually-exclusive structural attributes; the properties of any one particular type of aerogel material are thus unlikely to have both the desired impedance and the desired absorption properties. The matter is further explained as follows.

Impedance may be described as the innate ability of the material to allow the sound waves to pass therethrough, and if those waves are to pass "cleanly" from the air to the material without any hindrance, and as though the material was just more air, then the impedance of the material has to match the impedance of the air. However, if the impedances are not matched then the material behaves as though it were different from air, and there is formed in the medium through which the sound travels a discontinuity at the interface between the two media (air and aerogel terminator), and at the discontinuity it is likely that some of the sound will be reflected back (to the transducer) rather than traveling on into the terminator (and being absorbed). Thus, the effect of the material having an acoustic impedance significantly different from that of air is to produce a significant reflection of incident acoustic waves (i.e. the reflection coefficient R>>0.0), and in consequence a correspondingly significant amount of sound energy radiated by the rear of the acoustic transducer towards such a material will be reflected back towards the transducer and interfere with its operation in an undesirable manner. The reflection coefficient of aerogel is also a strong function of the macro physical form (rather than just the micro material composition) of the material: in particular it is found that monolithic aerogel even of very low density is still highly acoustically reflective in the 20 Hz–20 KHz band; the same is also true of aerogel ground into very fine powder form.

The problem, then, is to construct an aerogel absorber which has a low reflection coefficient—which is "impedance matched" to the air, providing only a trivial discontinuity effect—while at the same time having a high absorption capability. Unfortunately, in practice it is found that materials that have very low acoustic reflection coefficients R tend to have low absorption coefficients A too. In consequence, whilst they produce little reflected energy to interfere with an adjacent transducer, they do little to absorb the rear acoustic energy either. The converse is also found to be true in practice, i.e. that materials with high absorption coefficients A also have high reflection coefficients R. Thus, such latter materials absorb a good fraction of the acoustic energy that gets into them but in turn reflect a lot of the incident acoustic energy at their surfaces.

AEROGELS FROM PARTICLES WITH GAPS

A partial solution to this problem of optimizing the performance of the absorber is constructing the aerogel in the form of small particles with sizes in the several millimeter region, but arranging that the shapes of the particles are such that when the particles are packed there are still adequate spaces left between the particles to allow the passage of sound.

In another aspect, therefore, this invention provides an aerogel, suitable for use as an absorber of sound energy, which is constructed as a conglomerate of small particles with sizes in the several millimeter region with the packing of these particles being such that there are spaces left therebetween to allow the passage of sound.

The aerogel of this aspect of the invention is one which is formed from small but significant particles of aerogel material rather than from either a monolithic—all one piece—material or a finely-powdered material. The particles, which may cover a range of sizes and shapes, are preferably in the region of 0.5–20 mm across.

This aerogel is one which is constructed as a conglomerate of small particles which pack in such a way that there are spaces left therebetween to allow the passage of sound. Particle shapes which close pack—eg, cubes—are ineffective, as when so packed they behave like a monolithic aerogel, and have high reflectivity. Particle shapes which do not close pack include spheres and cylinders, and irregular particle sizes as are produced by crushing larger particles or monoliths. If, in addition to possessing a shape which does not close-pack, on the scale of a few millimeters, the particles are also rough-surfaces (on a much smaller scale), then they absorb sound even more effectively, and are preferred. Such particles when formed into a layer produce interstitial gaps in the size range between zero (where they happen to touch on flat or convex surfaces) and several millimeters.

AEROGELS THAT ARE GRADED

Another way of solving the impedance/absorbance dilemma is to layer the aerogel. If the aerogel absorber is fabricated such that, in the principle direction in which the sound energy to be absorbed travels through the absorber, its relevant properties are graded—either continuously or stepwise—from one side (say, the input side) to the other (the output side), then on the input side (where the sound energy from the acoustic transducer is incident) the material may be given the lowest possible reflection coefficient R, and on the output side (the side of the absorber furthest from the acoustic transducer) the material may be given the greatest possible absorption coefficient A consistent with an acceptably-low reflection coefficient. The result of this is that there are in effect multiple layers of material of gradually-increasing reflection coefficient in the direction from the input to output side of the absorber, which provides an overall low reflectivity which is a significant improvement on a uniform material. This is because very little sound is reflected at the input side interface because there the reflection coefficient is chosen to be lowest (though, because of the limitations of practical materials, in general this material will have a low absorption coefficient too) so the bulk of the incident sound will be transmitted on to the following layers of the absorber. Then, as the sound energy gets a little further into the absorber, it meets material having a slightly higher reflection coefficient but which also absorbs more strongly. Here a certain amount of sound energy is reflected back towards the input surface but this will be partially absorbed by the intervening material and partially reflected back towards the output side. As the sound progresses further into the absorber this process of partial reflection and partial absorption continues with successively less being transmitted through to the following layers of material, and more and more of the energy reflected back towards the input being absorbed and/or reflected back towards the output surface. Thus, it will be seen that there can be made a suitably-structured anisotropic and inhomogeneous absorber structure that is much superior to any isotropic and homogeneous absorber made of the same material.

In yet another aspect, therefore, this invention provides an aerogel sound absorber as described above comprised of multiple layers of materials of graded properties, or comprised of material of continuously varying properties throughout the thickness of the absorbing structure, in the principal direction of sound from the source.

More particularly, in this aspect the invention provides an aerogel, suitable for use as an absorber of sound energy, which is formed as a continuously or stepwise/layered graded structure from one side to the other, and wherein on the input side (where the sound energy from the acoustic transducer is incident) the material is given the lowest possible reflection coefficient R (and the maximum possible concomitant absorption coefficient A), and on the output side (the side of the absorber furthest from the acoustic transducer) the material is given the greatest possible absorption coefficient A consistent with an acceptably-low reflection coefficient.

The graded aerosol structure is made from a set of n aerogel (or other) materials $a_0, a_1, \ldots a_n$, with steadily increasing reflection coefficients $R_0, R_1, \ldots R_n$ and steadily increasing absorption coefficients $A_0, A_1, \ldots A_n$ (these materials are prepared from the set of all available low-reflection coefficient absorber materials; if any material to hand has the same or lower reflection coefficient R than any of the $R_i$, i=0 to n, but a higher absorption coefficient, it is substituted for that $R_i$). Examples of materials $a_0, a_1, a_2, \ldots a_n$ are the bead form of Matsushita SP-15, SP-30 and SP-50 respectively, and Hoechst HIL2.

A functional stepwise multilayer aerogel absorber may be made by overlaying successive layers of material $a_0, a_1, a_2, \ldots a_n$, each with thickness $t_0, t_1, t_2, \ldots t_n$, onto a supportive substrate that is substantially acoustically transparent over the frequency range of interest—eg, an open metal or plastic mesh or foam with hole or pore sizes smaller than the particle sizes of material forming the absorber. The resulting layered absorber has thickness $t_0+t_1+t_2+\ldots+t_n$ in the nominal direction of sound incidence. The individual thicknesses $t_0, t_1, t_2, \ldots t_n$, be determined in a number of ways. For instance, trial and error experiments, starting from the situation of $t_0=t_1=t_2=\ldots=t_n$, may be used to improve the absorption. Calculations, using the layered sound-absorption-and-reflection theory in J F Allard's "Propagation of sound in porous media", may also be used to optimize the layer thickness. However, the theory relating to aerogels is still poor, and experiments are essential.

A functional continuous "multilayer" absorber may be constructed similarly, except that the proportions of each material overlaid on the substrate are continuously varied as the layer builds up. Initially, 100% of the material is $a_0$, but an increasing proportion of $a_1$ is laid down such that when the total layer thickness is $t_0$, 100% of $a_1$ is being deposited. At that point the proportion of $a_2$ being deposited is slowly increased such that as the deposited layer thickness reaches to $t_0+t_1$, 100% of $a_2$ is being deposited. This process is continued, material by material, until finally as the deposited layer thickness reaches $t_0+t_1+t_2+\ldots+t_{n-1}$, 100% of material $a_n$ is being deposited. In this case the total layer thickness of the multilayer absorber is $t_0+t_1+t_2+\ldots+t_{n-1}$.

One application of these techniques uses as materials $a_0, a_1, a_2, \ldots a_n$ Matsushita aerogels SP-15, SP-30 and SP-50 in bead form (the beads are cylinders approximately 2 mm long and 1 mm diameter). First, there is constructed an acoustically-transparent supportive substrate—in the form, say, of a 300 mm by 300 mm by 40 mm basket of fine stainless steel woven wire mesh with holes ≅0.9 mm and wire size ≅0.1 mm diameter. A 13 mm thick layer of SP-15 is uniformly deposited over the mesh, and over that is deposited a 14 mm layer of SP-30, followed by a 13 mm layer of SP-50. The "basket" is then closed with a further piece of the same wire mesh (≅300 mm by 300 mm). In operation, the sound to be absorbed is allowed to impinge on the face whereon is deposited the SP-15. An absorption of approximately 8 dB down to a frequency of around 30 Hz is achieved, with a reflection coefficient smaller than 0.2. At higher audio frequencies, the reflection coefficient is smaller than 0.2, and the absorption substantially greater than 8 dB.

In the aerogel absorber structures of the invention wherein a particulate aerogel material is one of the components it is preferable to stabilize the structure by slightly bonding the particles together, conveniently with an adhesive. Suitable such binding adhesives are available from Hoechst, of Germany. The choice and quantity of the adhesive binder material can significantly (and often detrimentally) affect the structure's acoustic properties; most preferably, then, very small amounts are used.

Although, in the graded aerogel sound absorber of the invention, each and all of the layers in the structure can be aerogel material, nevertheless sound absorber performance may be further enhanced by using materials other than aerogels to form one or more additional layers. Such additional, non-aerogel layers are preferably those layers further away from the sound source, so that the non-aerogel material's higher reflection coefficient is effectively shielded from the sound source by the intervening layers of low reflection coefficient aerogel. The non-aerogel layers may be made from any appropriate material. Particular instances of such non-aerogel materials suitable for use as one of the higher absorption, higher reflection coefficient layers in such a multilayer sound absorber are ASTRON ASTRENE, and ASTROSORBs 8, 25 and M3 sheeting [available from Astron Elastomerprodukte GmbH, Austria]. Such materials are available in nominal 6 mm layers, but may easily be assembled in a thicker layers by adhesive bonding as required. The addition of one or more layers of these materials to an aerogel multilayer absorber can significantly increase the absorption without greatly affecting the reflectivity (if added to the side away from the sound source), but does add significantly to the cost and weight.

The graded acoustic absorber of the invention may also have its acoustic properties further modified and enhanced by pre-filling it with a gas with relevant properties differing from those of air, in the manner already described hereinbefore. Depending on the effect required, this gas can be, for example, neon, hydrogen, helium or sulphur hexafluoride.

Although aerogel sound absorbers generally, and more specifically the small particles and graded aerogel absorbers of the invention, have hereinbefore been described primarily in connection with their utilisation as resistive terminations for use with transducers, it will be clear to those versed in the Art that a low reflectivity absorber structure as so described above has application beyond that function. In particular, not only may such an absorber be effectively employed to absorb sound from any source, but in addition, and unlike most absorbers presently in use, it has the capability of operating effectively even at low audible frequencies, well below 400 Hz and extending all the way down to 20 Hz. Such additional applications include architectural acoustic control of rooms and buildings, reduction of sound emissions from machinery and plant, soundproofing of rooms, buildings and vehicles, ear defenders, and indeed almost any application where the absorption (rather than simply low transmission) of sound energy is important. In all of these, as well as the primary application envisaged, the very low density of aerogel materials contributes to the overall light weight of the absorber structure which is highly advantageous in some applications, especially where moving or movable parts are involved, e.g. vehicles and portable loudspeakers/earphones.

AEROGELS AS TRANSDUCER DRIVE ELEMENTS

One aspect of this invention relates to the use of aerogels as transducer elements.

There has above been described the use of aerogels as resistive terminations in acoustic transducers. It is possible, however, to use an aerogel as the material from which is made a more active part of a transducer, namely the drive element itself.

As observed herreinbefore, an acoustic transducer of the "loudspeaker" form is basically an electromechanical device in which a diaphragm is driven by a "translator"—a moving coil or a magnet itself driven by an applied magnetic field. Magnets tend to be rather heavy, so perhaps the best loudspeakers are most commonly of the light weight moving-coil design, and can be made to operate up to and beyond the limit of human hearing (20,000 Hz or more); the lighter the coil the more easily it can be moved, and thus the higher the frequencies that can faithfully be reproduced by the loudspeaker.

Now, aerogels are extremely light, and if they were made to have a suitable magnetic character they could be used as the moving magnet in a moving magnet transducer to operate at either higher frequencies or higher efficiencies than has hitherto been possible.

Such aerogels have now become possible, and therefore, in yet another aspect of the invention there is provided a moving magnet transducer wherein the moving magnet element is a magnetic aerogel structure.

More particularly, the invention here provides a piston or translator, forming the moving part of a linear electromagnetic transducer, being made of a magnetic form of aerogel—either magnetically-doped non-magnetic-aerogel or intrinsically magnetic-aerogel—and being suspended in a controllable magnetic field as for example produced by one or more current carrying coils, so as to form a linear motor with very low moving mass.

The common aerogels are usually made of silicate material, and have been reported with densities as low as 3 kg/m3 (thus, just three times denser than air). Typical examples are Matsushita's SP-15, SP-30 and SP-50 mentioned above. Magnetic aerogels have been demonstrated by distributing particles of ferrite or other magnetic materials throughout the aerogel structure; typical such magnetic aerogels are those produced by the Microstructured Materials Group of Lawrence Berkley Laboratories (USA) by chemical deposition of iron oxide ($Fe_3O_4$) into silica aerogel, and while this necessarily results in an increased-density aerogel structure nonetheless relatively very-low density magnetic translators for moving-magnet transducers can be made from such magnetic aerogels, and have shown promise in the manufacture of higher-frequency transducers.

However, in the present invention the preferred magnetic aerogels are made directly from materials—other than silicate—that are inherently magnetic. Such materials are $Fe_3O_4$, neodymium/iron/boron compounds, cobalt/samarium compounds, and other materials known to have useful magnetic properties, including many metal oxides, and their use can give rise to extremely low density magnetic materials from which may be fabricated the desired transducer elements, translators for moving magnet transducers.

Whilst the magnetic aerogel material, and the element made therefrom, is relatively weak structurally, it should be noted that with this construction the driving force acts throughout the body of the material (it all being magnetic), and thus there are no internal driving forces tending to distort the translator element. As a result, the element may be made of extremely light construction, for great stiffness is unnecessary.

In this aspect of the invention the "magnetic" aerogel is fashioned, preferentially as a monolithic aerogel part, into a suitably shaped translator which, when driven by the magnetic field of an adjacent current-carrying electrical conductor (conveniently formed into a coil of many turns), experiences a motive electromagnetic force, and if suitably suspended (by, for example, a bearing of some kind) then moves under the influence of that force. The magnetic aerogel element, in the transducer of which it is a part, may move the surrounding air either directly or via an attached diaphragm structure chosen to increase it cross sectional area in the plane orthogonal to the direction of motion.

One suitable form of suspension is a linear bearing of the type the subject of Hooley British Patent Application No. 2,322,232 (P1481Sub), which adds almost no moving mass, seals the gap between the moving and fixed components, is silent in operation, and is almost frictionless. Another useful form of suspension for this device is to use a pair of inverted thin-walled elastomer tubes attached one towards each end of the translator on the inside, and to the outside supporting framework on the outside. Again, such a suspension can provide very long travel with little reactance, low mass, and low noise, and can be designed to seal the gap between the translator and its surrounding framework. These particular bearings have the added advantage in this assembly of acting over a large area of the body of the translator, and thus spreading the forces imposed on the translator body, which again is therefore not required to have great strength, allowing the use of inherently low strength aerogel materials.

For the aerogel translator described above to work most effectively as an acoustic 'piston' it is desirable that it should be made largely impervious to the surrounding air. This may be achieved by coating the aerogel with a thin, light, skin of gas-impervious material, such as very thin plastic film, or very thin metallisation. A variant on this is to enclose the aerogel translator in a thin impervious bag or sack (or covering) and then evacuate some or all of the air from inside the covering (and necessarily also, from within the body of the aerogel), after which the covering is sealed. Where the aerogel had a very low density (perhaps as low as 3 kg/m$^3$), removing the enclosed air would further significantly reduce the mass of the aerogel translator as a whole, the static pressure of the atmosphere on the covering and thus on the aerogel itself providing additional beneficial pre-stiffening of the translator component. A suitably thin impervious coating, of plastic for example, can be made so as to add negligible additional weight to the translator. Typical materials widely available for this coating, or for the bag or sack, or PVDC (polyvinylidene chloride), PVDF (polyvinylidene fluoride), PET (polyethylene terephthalate) polymers, possibly with an additional very this metallised coating to improve their gas impenetrability.

An additional useful adaptation of this idea is to mount the magnetic aerogel on rotary bearings, and to arrange suitably-placed current-carrying coils around it to form a rotary electric motor. With a very light, and thus very low inertia, rotor, such a motor has very good dynamics. In this case, then, the aerogel transducer element is being used in a "rotary" transducer, converting electrical energy not to linear motion (and, by driving air before it, to sound) but instead to rotary motion.

In this way the invention provides a rotor for an electric motor, which rotor is constructed of a magnetic form of aerogel—one which is either magnetically-doped non-magnetic-aerogel or intrinsically magnetic-aerogel—and is in use suspended in a controllable magnetic field as for example produced by one or more current carrying coils, so as to form a rotary motor with very low moving mass.

AEROGELS AS TRANSDUCER ELEMENTS IN VISIBLE-IMAGE-FORMING DEVICES

In another aspect still the invention is concerned with aerogels useful as parts of imaging systems.

Much effort is presently being expended to provide a commercially and technically acceptable form of three-dimensional television. One avenue of approach is by way of a projection hologram, and some experimental systems have been disclosed, while another is to employ a solid, 3D "image tank"—rather like a 3D version of a conventional television screen—within which the image is constructed to have not only height and breadth but also depth. The technique usually proposed is a tank, or solid block, of a transparent material that can be caused to fluoresce (or glow by phosphorescence, like a conventional TV screen) when impacted or illuminated by two or more energy beams—focused electron beams, say, or laser light beams—but not when impacted by only one such beam. Here, too, there has been some success—a block of the right material can be caused to glow where two laser beams meet to define a point within the block, but not merely where a single beam traverses the block but there are serious problems with finding the right block material. These problems are mostly centred on the fact that all known usable materials—materials that will glow as required—are relatively dense, and a block that is of a decent size, giving a comfortably-viewable image, at least a foot (30 cm) across and deep, is extremely heavy.

It is here that the invention plays its part, by suggesting that there could be utilised as the block material a monolithic transparent aerogel of a sort capable of fluorescence with the right stimulation. By probing such a block with one highly-focused, or alternatively with two or more intersecting, possibly pulsed, possibly invisible (e.g. infra-red or ultra-violet) laser beams arranged such that at their focus or point of intersection they produce the appropriate conditions to stimulate fluorescence in the aerogel, a point source of light may be created anywhere within the aerogel monolith and visible through four pi steradians. By rapidly scanning the laser beam or beams a 3D image can be projected within the areogel monolith, and with an adequate update rate moving images can be so produced. The great advantage of this scheme over others using 3D point addressing in a transparent material is the very low density of the aerogel, which thus allows very large display sizes (e.g. one meter cubed) but with practical weights (less than 100 Kg and perhaps as low as 10 Kg—a mere 22 lbs, less than the weight of many present-day television sets). In addition, compared to any similar scheme using a gas as the fluorescing medium, significantly improved light output would be expected from an aerogel system as described.

In this aspect, then, the invention provides a form of three-dimensional video display wherein there is a solid, 3D "image block" within which the image is constructed by scanning the block internally with one or more suitable stimulating energy beam, the block being formed of a transparent material that can be caused to glow when suitably impacted or illuminated the beam(s), and wherein the block is an aerogel.

In this aspect the invention provides an image-forming device which is essentially a monolith of transparent, visibly fluorescent aerogel. It is drivable by one tightly focused, or two or more intersecting, possibly invisible (e.g. infra red or ultra violet) energy (conveniently laser) beams, and is so arranged that, at the point of beam focus or intersection, the aerogel there fluoresces.

By suitable choice of either or both of the energy beams sources and the nature of the fluoresecent material within the aerogel, the imaging arrangement as described above can be given the additional property that the colour of the light emitted by the fluorescence can be varied either continuously over the visible range, or alternatively so as to include at least the colours red, green and blue, when stimulated by either different wavelengths or by different intensities, or different mean energies, or different combinations thereof, of a laser beam or beams, so as to form a 'full-colour' three-dimensional addressable display.

Several possible shapes are useful for such a display. A rectangular block may be used for viewing principally from one of a number of fixed positions, eg adjacent to the centre line of each of the six faces. If, however, it is desired to view the display by moving around it, then a spherical, spheroidal, or ellipsoidal block of aerogel has distinct advantages as it lacks the corners of a rectangular block, and thus avoids the distortion in viewing produced by moving around a rectangular block.

The aerogel itself can be any suitable transparent aerogel. One such is Matsushita's SP-50, and others are noted in the *Aerogels 5, Proceedings of the Fifth International Symposium on Aerogels*, Publication mentioned hereinbefore.

PIEZOELECTRIC DEVICES AS ELECTROMECHANICAL DRIVERS

Another aspect of the present invention relates to novel constructions of piezoelectric devices for use as electromechanical drivers.

Transducers which convert electrical energy to mechanical energy are well known and come in a wide variety of forms perhaps the most common of which is the loudspeaker (which converts electrical signals into the motion of a piston or like device the movement of which is caused to displace air so as ultimately to "change" the electrical signal into audible sound).

Linear actuators of many varieties are also well known, examples including hydraulic, pneumatic and internal-combustion cylinders, electromagnetic solenoids, linear motors of many kinds, piezoelectric and magnetostrictive actuators, and inch-worm devices.

Where a relatively small, self-contained, compact and electrically-operated linear actuator is required capable of movement of merely a few millimeters and/or of the application of small forces in the Newton range, then solenoids are generally preferred. It would be attractive to utilise a piezoelectric device instead, but unfortunately the present-day piezoelectric devices generally have a problem producing millimeter-range displacements if direct acting, and even 'stacks' of piezoelectric plates produce only small deflections with practical applied voltages. Moreover, piezo devices become quite bulky if used in the 'bender' mode; in this mode it is usual to provide an elongate two-layer cantilever beam made of a piezoelectric unimorph (a single shape-changing layer on a shape-fixed layer) or bimorph (two shape-changing layers back to back), which beam bends significantly as the activating voltage is applied, but such a beam necessarily extends some distance away from the axis of output movement.

Nevertheless, some use of piezoelectric benders in place of solenoids has been made, particularly in the application of pneumatic valves, where a multilayer bimorph has been used to provide reasonable deflection from relatively low operating voltages. Moreover, in the Specification of the Hooley British Patent Application (P1481Sub) aforementioned there is described a helical tape-wound bender geometry suited for applying radial "squeezing" pressures to a translator mounted therewithin via a linear bearing. This helical bender has electrodes on its radially inner and outer surfaces which are split half way along the axis of the helix and are cross-coupled to produce, when driven, a reduction in helix radius at one end and an increase in helix radius at the opposite end. The present invention concerns a more generally useful manner of substituting a piezoelectric device for a solenoid—of retaining the compact cylindrical shape of the solenoid with the main length of the actuator aligned along (rather than at right angles as in a classical bender) to the direction of movement.

The helically-wound piezo device described in the aforementioned Specification is one wherein the piezoelectric material is tape-wound, as though a length of tape or ribbon had been wound in the conventional fashion around the outside of a cylinder. By contrast, in this aspect of the present invention a piezoelectric bender is made in the form of a flat- (or edge-) wound helical coil, with the direction of the applied electric field being between the two surfaces of the flat-winding (i.e. nominally aligned along the direction of the axis of the helical coil).

To best visualise the geometry of this structure, consider first a conventional elongate rectangular unimorph or bimorph piezoelectric 'bender', with a thickness t (smallest dimension), width w (intermediate dimension) and length l (greatest dimension). The morph is constructed of two layers (which together have the total thickness t), and the applied electric field is in the direction of the thickness, so that if V volts are applied then the electric field in the morph has magnitude V/t. Such a field will cause the morph to bend preferentially in a direction at right angles to the length and width dimensions, such that the thickness direction lies within that plane of bending. Next, consider the undeflected rectangular morph lying flat on a horizontal surface, with the thickness t vertically aligned, and placed with its side at one end adjacent to and touching a cylinder of diameter d standing on the surface with its axis also vertical. Now imagine that the morph is flexible, and with the end touching the cylinder held stationary, the morph is edge-wound around the cylinder (i.e. in the plane of the surface) so that it forms after one turn an annulus—a circle of inner diameter d and outer diameter approximately d+2 w. If, as the morph is wound around the cylinder, it is raised by at least a height t per turn then it is possible to continue winding it into a continuous helix with each turn being on top of its preceding turn, thus giving a helix of pitch p (where in this case p=t). If the pitch p is made greater than t then there will be a space between each turn of width p−t. That describes the geometry of the helical bender of the invention; the thickness (or smallest dimension) is aligned substantially axially along the helix, the width (or intermediate dimension) is aligned radially along the helix, and the length (or greatest dimension) is aligned helically along the helix, and in operation the morph is polarised in the thickness direction.

Note, incidentally, that it is not being suggested that the above method is necessarily a practical means of constructing such a helical morph: this is merely a description to portray the desired geometry (however, it is in practice possible to make a helical morph in much this manner if the winding into a helix is done while the ceramic layers of the morph are still in the green or unsintered state, and in practice if the green ceramic is suitably plasticised).

In this aspect, therefore, the invention provides a unimorph or bimorph piezoelectric 'bender' formed into a flat- (or edge-) wound helix.

More particularly, this aspect of the invention provides a unimorph or bimorph (morph) piezoelectric 'bender' (bender) formed into a 'flat-wound' helix—i.e. where the thickness or smallest dimension of the bender cross section is aligned axially along the helix, the width or intermediate dimension of the bender is aligned radially along the helix, and the length or greatest dimension of the bender is aligned helically along the helix—where the pitch of the helix is greater than the thickness of the bender, and where the morph is polarised in the thickness direction (i.e. nominally along the axis of the helix), and wherein electrically-conductive electrodes are deposited along the length of the bender on both of the largest surface area sides of the bender (i.e. on either side of the thickness direction) and are drivable by an electrical signal so as to cause the helical bender to exhibit a dimensional change in the axial direction when so driven.

In use the morph is polarised in the thickness direction (i.e. nominally along the axis of the helix—a direction approximately parallel to the axis of the helix). Consider the effect of applying an electric field in this direction along the thickness dimension. Each part of the helical bender will try to bend nominally in the thickness direction, and this attempt will, because of the helical geometry, cause the entire helix to lengthen or shorten (if the pitch p is not greater than the thickness t then the helix will not be able easily to shorten). There will also be a small deflection orthogonal to the thickness direction which will mostly contribute to a slight increase or decrease in the diameter of the helical coil, but his effect will be small compared to the length change in the helix, due in part to the structure and alignment of the morph relative to the helix. Depending on the chosen materials, the achievable deflection along the direction of helix axis, per size of helical coil, is considerable compared to that achievable using a comparably compact bender beam or stack. For example, a practical morph of width 8 mm and thickness 1 mm formed into a helix of inner diameter 16 mm and outer diameter 32 mm, with 12 turns at 2 mm pitch, will have overall cylindrical dimensions of 32 mm diameter and 24 mm length, but will have the equivalent bender-length of a cantilever beam bender (of the same width and thickness) of approximately 910 mm (nearly a meter), and will deflect well over 10 mm with practical drive voltages. This is quite comparable to the performance possible with a similarly-sized solenoid (though perhaps with somewhat less output operating force), and such a helical bender has the great advantage over a solenoid that once actuated it requires no static holding current, and therefore dissipates essentially zero energy as heat, whilst still producing a static output force. The bender also has very small inductance, and is free from the inductive switching transients that are a problem with solenoids.

In operation the morph is, as just described, polarised in the thickness direction, and it is convenient to effect this utilising electrically-conductive electrodes deposited along the length of the bender on both of the largest surface area sides of the bender (i.e. on either side of the thickness direction), and then driving these by a suitable electrical signal so as to cause the helical bender to exhibit the required associated dimensional change in the axial direction.

One method of constructing such a bender involves co-extrusion of two (or more) layers of plasticized piezo-electric material, typically a lead zircondium titanate (PbZTi, or PZT) ceramic, to form a unimorph, bimorph or multimorph. The extrusion is effected through a rectangular aperture nozzle of exit dimensions w x t and so arranged internally that extrudate issues from the exit aperture at a rate which is a function of position across the "w" dimension of the aperture; the effect of this is that upon so exiting the extrudate "curls", and in fact forms into a circle or helix if so coerced by means of an external cylindrical former of diameter "d" and winding arrangement, with inner diameter d and outer diameter d+2 w. In order successfully to achieve such co-extrusion it is necessary to grind very finely and uniformly the PZT powder (obtained, for example, from Morgan-Matroc), and to mix it thoroughly with a suitable plasticiser (eg polyvinyl acetate, PVA) and water.

The separate layers are loaded with more or less silver oxide to make a unimorph—active layers with a small proportion of silver oxide, say 2%, and conductive inactive layers with somewhat more silver oxide, say 20%. For a two-layer device, one active and one inactive layer are co-extruded together such that their total thickness is $\cong t$, and each has a thickness of $\cong t/2$ after extrusion. For a multilayer device, active layers are alternated with inactive layers, each of nominal thickness t/n, to form a total bender thickness of t after extrusion.

Once the two- or multilayer extrudate has been extruded and "wound" onto the former of diameter d, it is sintered on the former in a furnace at a temperature in the region of 900–1,000° C. Surface electrodes can then be added to any external active layers by, for example, the sputtering of a conductive material such as silver or aluminum.

PIEZOELECTRIC DRIVER DEVICES WITH INTEGRAL POSITIONING AND CONTROL MECHANISMS

This aspect of the invention relates to the field of actuators and sensors, and in particular to unimorphs, bimorphs and multimorphs made of piezo-electric material.

Piezo-electric actuators of many types are well known in the art. The direct piezoelectric effect is generally rather a small effect, of the order of $10^{-10}$ m/v, so that to get substantial deflections using the effect either very high drive voltages are required or a large stack of low-deflection piezoelectric devices must be used. In either case, the achievable deflections are limited practically to the low-micron range.

When a greater deflection is required, various configurations of "bender" are used. A bender is a two-layer device wherein a piezoelectric layer is laminated (and intimately bonded together) with either a non-piezoelectric layer (making a unimorph) or a piezo-electric layer (a bimorph). In a unimorph, when the piezoelectric layer expands or contracts under the influence of a drive voltage, the laminate as a whole is caused to bend due to the differential deflection between the laminate's layers. In the bimorph—two piezo-electric layers laminated together—the two layers are poled and then connected to the drive voltage in such a way that when one layer of the laminate expands due to the drive voltage, the other contracts, and vice versa. In this way, the laminate again bends due to the differential deflection between the laminate layers.

It is also known to stack multiple layers such as have been described, either to achieve greater deflection output-force, or, by using multiple thinner layers, to achieve a comparable output force from a lower drive voltage, or for both of these reasons.

In this way, such piezoelectric benders as are presently available can produce substantial deflections—on the order of millimeters—with drive voltage as low as 30V to 60V.

Unfortunately, piezoelectric materials able to produce large deflections per volt ("high activity" materials), are also prone to considerable hysteresis. The generally undesirable result of this is that an actuator comprising such a piezo-electric bender is difficult to control precisely, because the hysteresis eliminates the possibility of there existing a simple relationship between input drive voltage and output deflection.

A similar effect results from the fact that piezoelectric materials have non-negligible compliance. In the case of their use as a bender-type actuator, the external load applied to the actuator will also determine to an extend, the amount of the output deflection.

Thus, conventional benders have shortcomings for precision actuator service.

The present invention proposes a surprisingly simple solution to these problems. More specifically, it suggests in essence the addition to the bender structure of a further laminate layer of a piezo-active material—as explained below, this piezo-active material may be piezo-electric or it may be piezo-resistive—the function of which added layer is (solely) for sensing and responding to the actual deflection of the bender device. If this additional sensing layer is made of a very low hysteresis piezo-active material, then when the bender is deflected, the resulting activity response of the sensing layer will be largely free of hysteresis effects (the selection of the material for this sensing layer may be made on grounds of low hysteresis and high piezo-active response alone, as it plays no active part in causing the deflection of the bender). Furthermore, if this sensing layer be made of as high-compliance a material as possible—either by choice of the piezo-active material, or simply by making the layer sufficiently thin, or both—then the presence of the sensing layer minimally loads the primary bender device, and so it has little effect on the device's output deflection. Finally, if the control system driving the bender be provided with the appropriate inputs and outputs, it can then use the output signal from the sensing layer in a feedback loop to control closely the actual output deflection, largely free of hysteresis errors, and also independently of the mechanical loading of the device.

In this aspect, then, the present invention provides a bender structure piezoelectric device wherein there is an additional laminate layer of a piezo-active material the function of which is for sensing and responding to the actual deflection of the bender device.

Such a sensing layer may be added to any of the unimorph, bimorph, single- or multiple-layer benders of all kinds that are currently known, in order to provide direct feedback of the deflection state of the bender, and thus greatly to simplify the precise control of such a bender. And the bender may be a flat- (or edge-) wound helical device as just described, or it may be one of the tape-wound helical devices the subject of the aforementioned British Patent Application.

The added sensing layer used in the present invention is a piezo-active material; this piezo-active material may be piezo-electric or it may be piezo-resistive. A piezoelectric material is one that outputs a voltage when it it mechanically deformed (and, or course, vice versa: when a voltage is applied across it then it mechanically deforms). By contrast, a piezoresistive material is one the electrical resistance of which changes as it is mechanically deformed. In the present invention either type may be employed—with a piezoelectric material the associated control system detects the output voltage, while with a piezoresistive material the control system applies a voltage and detects the change in current and thus resistance, or applies a current and detects the change in voltage.

The sensing layer may be added to either of the outside layers of the laminate structure, or indeed, added as one of the inner layers of the structure. For example, it may be arranged to be the layer closest to the neutral axis of the bender, generally near the centre of the bender layer-stack, so as the better to detect the average deflection of the bender structure. Positioning the sending layer close to the neutral axis also subjects the sensing layer to the least strain, and thus minimises hysteresis effects.

Although the bender structure of the invention need only have a single added layer, it can have two or more. Thus, two (or more) sensing layers may be added to the bender structure in such a manner as to minimise hysteresis effects in the sensing layers by arranging for some cancellation of the hysteresis effects between the layers when used in combination. In one such arrangement, a differential amplifier can be used to sense the difference of the output signals from two such sensing layers to provide a net signal from the sensing layers that more precisely indicates the actual deflection of the bender. When the added layers are piezoresistive sensing layers, they may each be arranged to sense the strain in the bender, whereafter, by suitable electronic techniques, their deflection sensitive signals may be made to add (for example in a differential amplifier) while their temperature dependent and other non-strain-related resistance changes may be made to largely cancel in the electronics sensing circuitry.

Where benders are fabricated by bonding previously separate layers of piezoelectric material together, then the sensing layer may also be bonded into the laminate so constructed, and may, for example be made of a totally different type of material optimized solely for its sensing rather than its deflecting properties. For example, both piezo-electric and piezo-resistive polymers have much higher compliance than equivalent thickness piezo-active ceramics, and whilst in some cases they are less sensitive than some piezo-active ceramics they are nonetheless good candidates for this sensing layer application because of their low cost, high compliance, and the ease with which they may be bonded and fabricated.

Where benders are fabricated from two or more layers of piezoelectric ceramic (bimorphs or multimorphs) and/or one or more layers of non-piezoelectric material together with one or more layers of piezo-active ceramic (unimorphs or multimorphs), and where such lamination is carried out prior to the firing or sintering process (i.e. at the "green" ceramic stage), then it is still possible to add one or more sensing layers of piezo-active ceramic at this same "green" stage, before firing, and to choose the material of the sensing layer on the grounds of suitability for sensing rather than of deflecting under drive voltage (e.g. the choice is for low hysteresis, and/or high compliance, and/or high sensitivity). Alternatively, the sensing layers may be bonded onto such "fired laminates", after firing, in which case non-ceramic sensing layers such as piezo-active polymers may be used in addition to high-temperature-resistant piezo-active ceramics.

In particular, the piezo-active ceramic extrusion and calendering processes pioneered by Pearce et al may be used to produce, in one manufacturing process, a multilayer bender device complete with deflecting layer(s) and piezo-active sensing layer(s), with electrodes fired in during one and the same process.

In the manner described, as piezoelectric actuator may be constructed such that, with a suitable control system able to make use of the deflection feedback signal available from the sensing layer(s), it is capable of precise control without the need for any additional external position sensing devices—and thus it can be made at significantly reduced cost.

One preferred candidates for the piezoelectric sensing layer is the same (active) PZT material from which the underlying bender is fabricated, eg Morgan-Matroc PZT-4D, PZT-5A or PZT-5H (=Navy Types I, II and VI). Alternatively, where the piezoelectric sensing layer is laminated by bonding onto the bender after the bender has been sintered, the sensing layer may be made of PVDF piezoelectric polymer.

Lastly, if the bender itself is made of piezoelectric polymer (no sintering step) then the sensing layer—of, say, PVDF—may be added at the same time as the bender is fabricated.

One preferred candidate material for the piezo-resistive sensing layer is ruthenium oxide. This material may be applied in some appropriate manner as a thick film to a surface of a bender structure, possibly over the top of an insulating thick-film layer, then "cured" (sintered) to form the required ceramic structure. Thick film layers of this kind have the advantage of requiring only a relatively small quantity of the piezo-active material, which permits the construction of a low-cost sensing layer. Suitable application processes include the conventional methods of thick-film technology, including screen printing, doctor blading, painting and spraying techniques. In this case the piezoactive material is applied to the bender structure in the form of an "ink" being a mixture of, amongst other components, piezoactive, conductive and binding agents. Whilst the piezoactive layer(s) may be embedded within the bender structure, in a preferred embodiment the layer(s) are applied post-sintering, to maximize signal and minimise reactions.

One particular application for a bender-type piezoelectric device of the invention—one having an integral sensing layer—is an acoustic transducer, wherein the bender is arranged to produce movement in the air, and thus sound waves, in response to an input drive voltage (an electrical signal representing the sound), in the manner of a loudspeaker. In general, because of the aforementioned hysteresis and load-dependent deflection effects, such transducers can be significantly non-linear, which is generally undesirable, as it produces distortion in the output sound. The providian of one or more integral piezo-active sensing layer easily and cheaply provides sensing signals which may be used in a feedback control system to eliminate the greater part of such non-linearties, and thus to minimise such acoustic distortions.

Piezoelectric transducers that can benefit from the present invention include the type of device the subject of the Hooley Britian Patent Application No. 2,322,232 (P1481Sub) aforementioned. This Hooley device is an alternative helical actuator which is more similar to a simple bender (but in this case a bender that has been coiled helically) than to the Pearce device. If, however, there is added to the Hooley helical bender actuator one or more additional piezo-active sensing layer—in this case as an additional laminate layer coiled helically conformally with the deflecting layers—the added layer(s) can then be used to sense the deflection of the helical actuator and to provide a feedback signal able to assist accurate control of the actuator. In so doing, of course, there can be reduced the effects both of hysteresis in the piezoelectric material of the actuator and also of the loading on the actuator. With a suitable feedback control system, substantially linear operation of the actuator is possible, making it suitable for use in, for example, an acoustic transducer.

Of course, if the piezoelectric material of a bender is operated largely in the approximately linear region, and is so chosen to have as low a hysteresis as possible, then inherent hysteresis effects may be made quite small, at least for AC signals. However, for DC drives, and for partially static loads, the addition of the sensing layer will provide information about the actuation point of the bender, by measuring the strain, and can thereby provide signals able to be used to reduce greatly the effects of varying loads on the actuation point.

In order to achieve better linearity of the piezoactive sensing layer around the zero strain point of the bender, the sensing layer may be bonded to the bender (in the post-sintereing method of construction) whilst the bender is maximally deflected in the direction that would normally apply compressive strain to the piezoactive layer, and the bender deflection maintained until the bonding process is complete. In this way, during all regions of normal operation of the bender, the piezoactive sensing layer will be in tension and so will for the most part operate well away from the zero-strain region.

PIEZOELECTRIC PRINT-HEADS

In yet another aspect the invention is concerned with a quite different type of piezoelectric actuator, namely that sort which is used in ink-jet printing.

In this type of device there is formed a block of piezoelectric material having a planar array of a large number of very fine, very close parallel chambers therewithin into which ink can be fed at one end and from which ink can be pumped out of extremely small apertures at the other end. The chambers are provided with opposed electrodes on either side, and when these are activated the piezoelectric material deforms, reducing the volume of the relevant chambers, and so driving ink out through the apertures.

These piezoelectric print-heads are presently manufactures by a laborious, multistage process, as follows. First, a suitable thick sheet of piezo-ceramic has milled into one major face a series of elongate parallel slots, leaving between the slots thin walls upon which are deposited electrodes. A top-plate of piezoceramic is then bonded on top of the milled face of the sheet, covering the slots and making bonded contact with the tops of each of the slot-walls, thus forming by means of this fabrication a series of parallel approximately rectangular tubes within the body of the composite structure. Finally, end plates are bonded onto the edges of the laminate perpendicular to the direction of the slots, to close off the tubes so formed, and into one these end-plates are bored precision holes, often using a laser beam, to form extremely fine nozzles.

In use, ink is allowed to enter the chamber via additional holes into the slotted chambers, and when a drop of ink is to be ejected the electrodes on the slot side walls are driven electrically in such a way as to deform the slot walls and reduce the volume of the associated rectangular tubular chamber, this reduction in volume causing the virtually incompressible ink to be ejected through the nozzle (some other arrangement is provided to prevent the ink being ejected through the filler holes). In practice the procedure is more complex than this brief description makes it seem; it involves, for example, carefully-timed waves being launched into the ink so as to cause the required ink flow.

This type of structure is capable of producing very fine resolution ink-jet print heads, and is already highly developed. However, its composite multi-process construction makes it a high-cost item, and the non-availability of large sheets of appropriate ceramic material prevents efficient mass manufacture of multiple devices. The process involves: the grinding to flatness of the piezoceramic base plate and lid-plate (currently necessary to ensure good mechanical alignment and bonding); the milling operation to produce a series of slots in the base plate; the metal deposition process to provide electrodes on the side walls of the cavities, and any ancillary intermediate cleaning operations between milling and metal deposition; and the alignment and bonding of the top plate to the milled and slotted base plate and any ancillary intermediate cleaning operations between metal deposition and bonding.

It is further purpose of this invention to describe an alternative, and much simpler and cheaper, manufacturing method for such devices, and for other similar devices.

The invention proposes that an ink-jet print-head style device be made by a simple multi-layer extrusion process of a type similar to that pioneered by Pearce et al at the IRC for Materials, University of Birmingham, to make co-extruded hollow PZT tubes and multilayer PZT bender structures complete with integral conductive electrode layers. Using an appropriately formed and dimensioned extrusion die together with a multilayered composition of piezoelectric ceramic paste and plasticiser, some layers of which have been well mixed with a conduction-producing material (such as silver oxide) to make a highly conductive but mechanically compatible material after firing, there is provided an extrudate in the form of an arbitrarily long strip—its length is determined only by the quantity of material to be extruded—having internally a multiplicity of tubular cavities, extending the length of the extrudate, the walls of which are the piezoelectric ceramic paste/plasticiser/conductor composition which, when fired, forms a conductive electrode layer on the surface of those walls.

In this aspect, then, the invention provides a method for making a channelled piezoelectric device like that required for a piezoelectric ink-jet print head, in which method a composition of piezoelectric ceramic paste, plasticiser and a material which becomes electrically conductive after sintering, which composition is capable of being fired to form a highly conductive but mechanically compatible material, is extruded through an appropriately formed and dimensioned extrusion die to produce an extrudate in the form of an elongate strip having internally a multiplicity of tubular cavities extending the length of the extrudate, the walls of which cavities are the piezoelectric ceramic paste/ plasticiser/conductor composition which, when fired, forms a conductive electrode layer on the surface of those walls.

The invention in this aspect provides a method for making a channelled piezoelectric device like that required for a piezoelectric ink-jet print head. An instance of a device other than a print head is a micro-pump of the sort used either for metered drug administration or for controlling sample flow in chromatographs.

The invention provides a piezo-device-manufacturing method in which there is employed a composition of piezoelectric ceramic paste, plasticiser and a material that makes the sintered composite ceramic electrically-conductive. This composition is in use extruded, and is then capable of being fired to form a highly conductive but mechanically compatible material.

Suitable piezoelectric material for making the ceramic include those Morgan-Matroc substances mentioned hereinbefore—Morgan-Matroc PZT-4D, PZT-5A or PZT-5H. They may conveniently be plasticised using PVA, and adding silver oxide to them makes them conductive after sintering.

The method of this aspect of the invention requires the composition to be extruded through an appropriately formed and dimensioned extrusion die to produce an extrudate. A co-extrusion die is most likely to be useful for this purpose. Here, two material entry points are provided into the die, which ultimately are extruded from the one and the same aperture or set of apertures (in the case of a multi-nozzle ink-jet pump die). Material is forced into the input apertures—plasticized active PZT paste into a first aperture, and a similar material but with the addition of the well-mixed-in conductivity-providing agent (eg silver oxide) into the other. Within the die, the main body of the extrudate is formed from material from the first aperture; however, the die is so arranged that a thin layer of (potentially conductive) material from the second aperture is deposited to the side wall positions of each of the slots of rectangular holes that appear in the extrudate, the die-internal pressures being such that the co-extruded materials, from the two input apertures are mutually in contact at the output aperture(s) to form a single continuous but laminated body of extrudate thereat.

In this aspect's method the composition is extruded to produce an extrudate in the form of an elongate strip having internally a multiplicity of tubular cavities extending the length of the extrudate. Most commonly the tubular cavities will preferably be rectangular in cross-section (the section is determined by the die apertures), but other convenient and easily-attainable section shapes are circular or elliptical (such sections are very difficult to produce by machining).

There is not practical limit to the length of continuous extrudate possible with this process, as material may be fed continuously into the input apertures. However, a practical limit of some tens of feet (several meters) for the sintering furnace dictates cutting the extrudate (extruded onto a carrier which provides support thereafter until completion of sintering) into corresponding lengths (or less). In a direct replacement for the present manufacturing process (by machining) the apertures may be rectangular.

The extrusion method produces an elongate strip having internally a multiplicity of cavities the walls of which are the piezoelectric ceramic paste/plasticiser/conductor composition which, when fired, forms a conductive electrode layer on the surface of those walls.

The co-extruded post-sintered conductive layers will generally be made as thinly as careful process control allows, but in any case in the 10–250 micrometer range. The layers on either side of the active PZT material forming the walls between the rectangular cavities, become conductive after sintering, and so provide the means by which in the device's use those walls can be electrically driven (and thereby deformed).

It will be seen that by means of the invention's simple, continuous, extrusion process there can be produced in one single operation, and in a manner that eliminates a great deal of complex and expensive processing (and so is at a considerably reduced cost), the types of structures needed for the variety of ink-jet print head previously described.

Whereas in the presently-used methods the whole assembly is required to have precise dimensional accuracy to allow registration of the separate components, in the method of construction of the invention there is far less requirement for absolute precision, as ultimately the only part that requires significant precision alignment are the ink-jet nozzles (which may be bored in an end plate in a similar manner as at present, and thus each can be positioned relative to the other nozzles with adequate precision by that process alone).

It will also be appreciated that the novel form of construction proposed here may also be used as the basis for a wide range of fluid pumping devices other than ink-jet print heads, to which the disclosed technique is in no way limited.

Embodiments of the several aspects of the invention are now described, though by way of illustration only, with reference to the accompanying diagrammatic Drawings in which.

Figure 4:
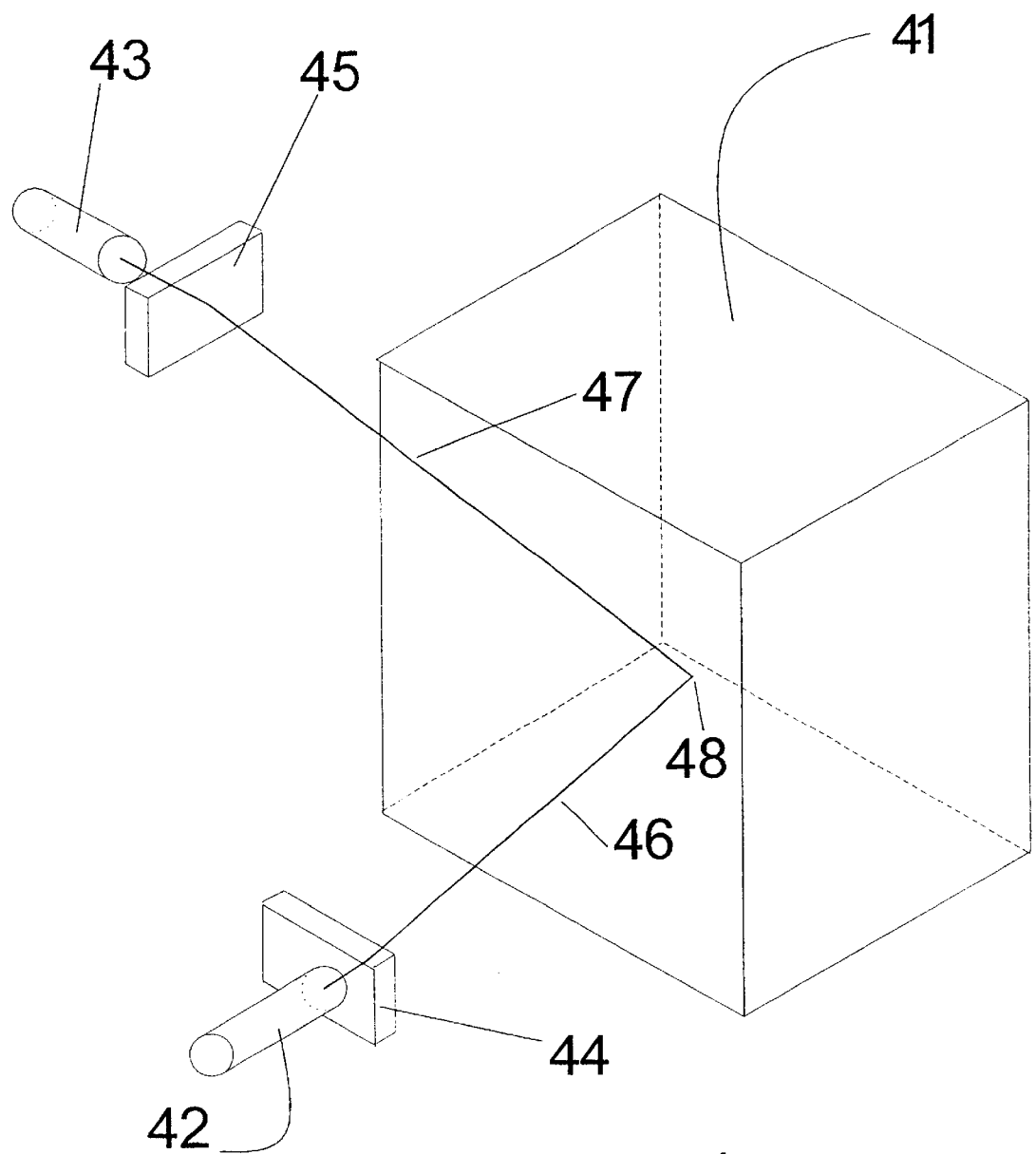
Figure 5:
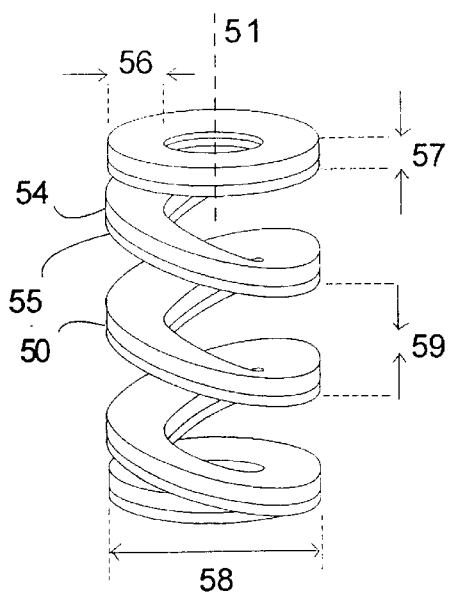
Figure 6A:
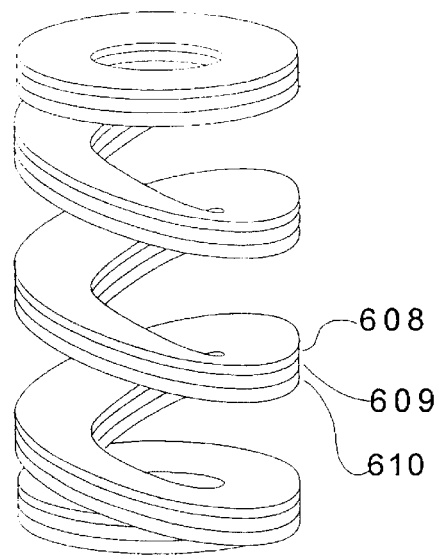
Figure 6B:
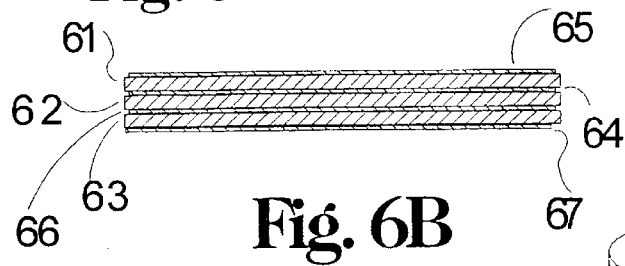
Figure 7B:
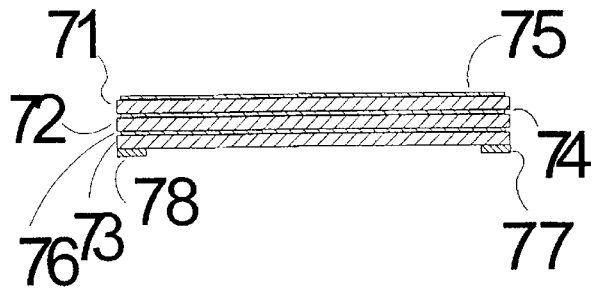
Figure 7A:
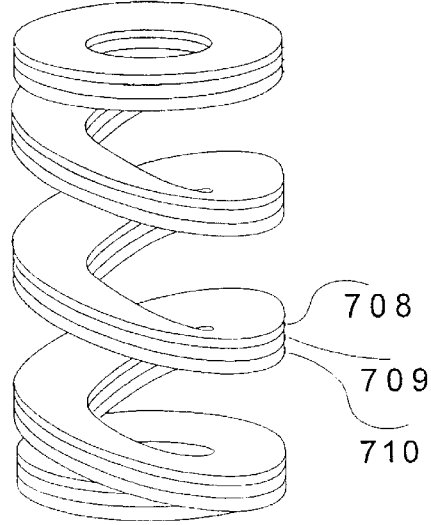
Figure 8:
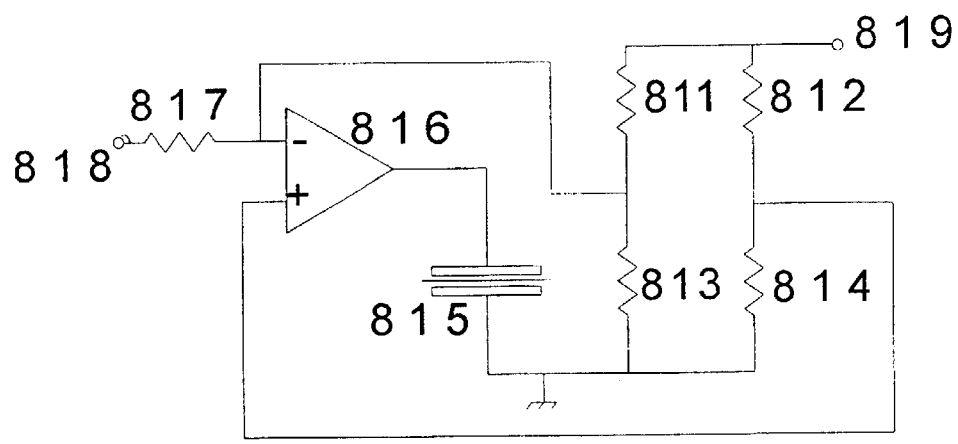
Figure 9:
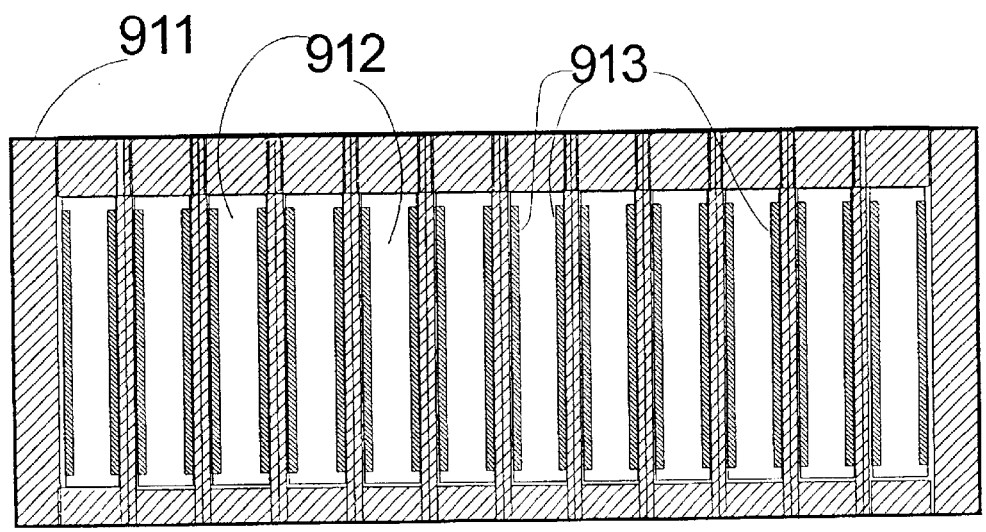

FIGS. 2A & B show longitudinal- and cross-sections of a transducer device utilising a magnetic aerogel translator acting as a piston;

FIGS. 3A & B show longitudinal- and cross-sections of an alternative form of transducer device similar to that of FIG. 2;

FIG. 4 shows a perspective view of an aerogel-utilising imaging system of the invention;

FIG. 5 shows a perspective view of a form of piezoelectric helical bender of the invention;

FIGS. 6A & 6B show both a perspective view of an alternative version of piezoelectric helical bender, using a piezo-active sensor layer, and also a section through a more conventional type of bender but using a sensor layer according to the invention;

FIGS. 7A & 7B show both a perspective view of another alternative version of piezoelectric helical bender, using a piezo-active sensor layer, and also a section through a more conventional type of bender but using a sensor layer according to the invention;

FIG. 8 shows a circuit diagram of a simple feedback control system for use with piezoelectric benders such as are shown in FIGS. 6 and 7;

FIG. 9 shows a section through a simple piezoelectric ink-jet print head device according to the invention.

Figure 1A:
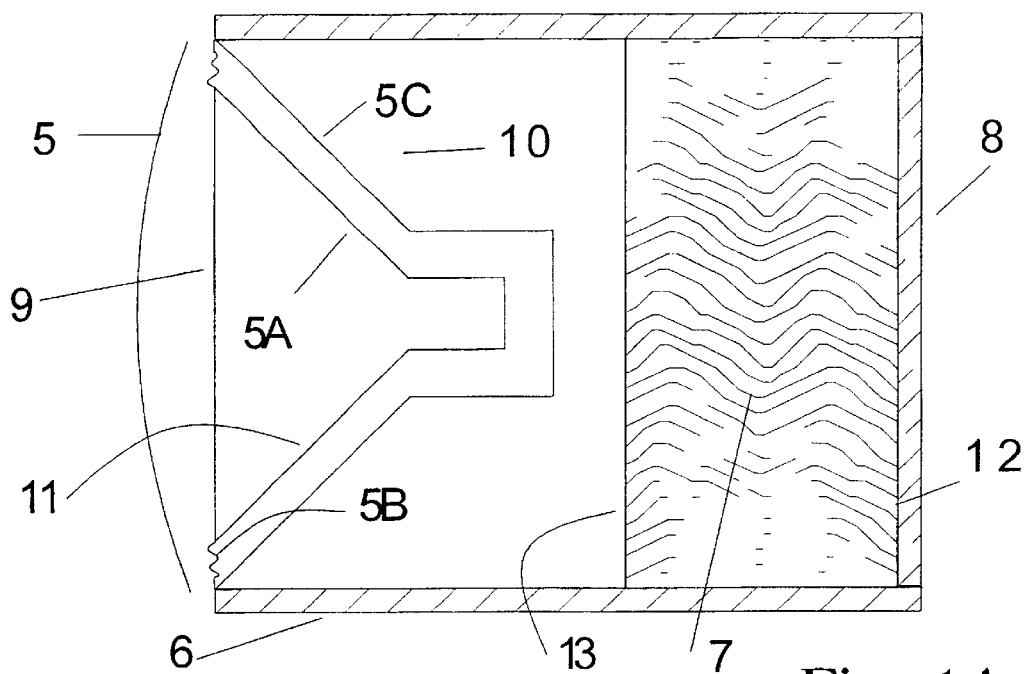
FIG. 1A shows a section through a loudspeaker utilising a sound-absorbing aerogel plug of the invention.

FIG. 1A shows schematically an acoustic transducer (5: cone/diaphragm 5A/5B supported within protective casing 5C) mounted and sealed into the end of a gas-impermeable tubular support (6), the transducer 5 emitting sound from its front face (9) and rear face (10). The translator component (11: 5A/5B) of the transducer 5 is assumed to be gas-impermeable also.

Behind the tranducer 5, and sealed into the support 6, is a plug (7) of aerogel whose density, material and pore size are chosen preferentially to absorb low frequency sound highly, and to absorb in particular that sound emitted from the rear face 10 of the transducer 5. The front face (13) of the aerogel plug is open to the rear of the transducer 5, whilst the rear face (12) of the aerogel plug is sealed from the surrounding atmosphere by a loose acoustically transparent gas-impermeable membrane (8) which is sealed at its periphery to the support 6.

The space enclosed by the rear of the transducer 5, the inside surface of the support 6 and the inside surface of membrane 8 is filled with a gas (or mixture of gases) chosen to maximise the absorption of low frequency sound from the rear of transducer 5. The arrangement is such that the destructive interference at the front of the transducer by the rear radiation is reduced by the aerogel absorber 7, whilst the acoustic loading on the rear of the transducer is minimised.

Figure 1B:
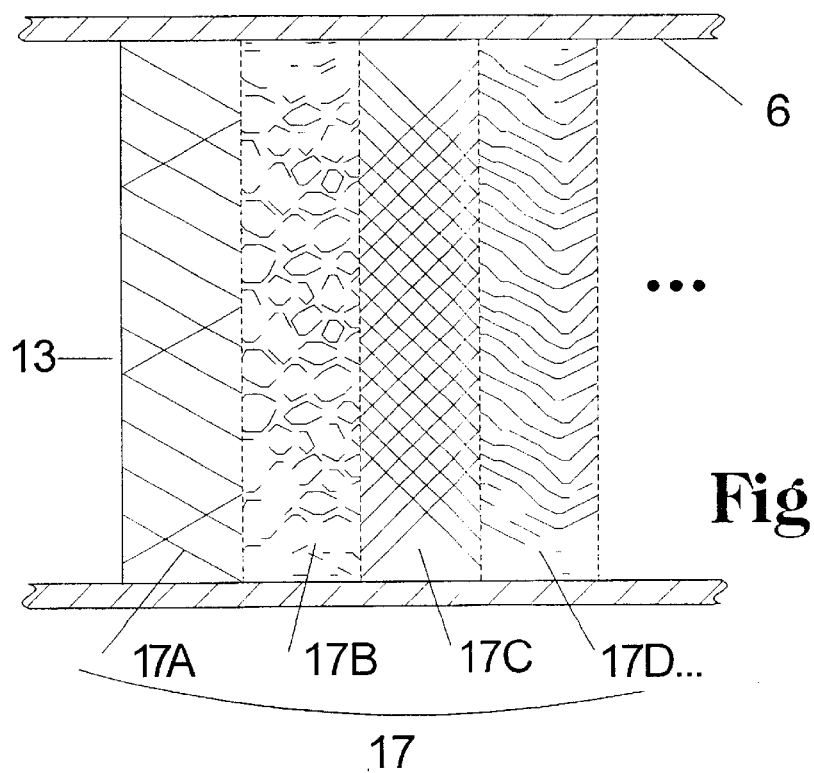
FIG. 1B shows in section a graded aerogel suitable for use in the aerogel plug of FIG. 1A.

FIG. 1B shows in section, and for use in an absorber system like that shown in FIG. 1A, a section through an aerogel plug (17, much like the plug 7 in FIG. 1A). Here, the aerogel plug 17 is structured as a number of layers (as 17A,B,C,D and so on: not all the possible layers are actually depicted in the Figure), each layer comprised of material differing in one or more physical and/or chemical characteristics from the adjacent layers, chosen so as to reduce the reflection of incident sound on face 13, whilst, subject to that first constraint, maximising the absorption of sound energy incident on face 13. In another alternative structure, not shown here, the individual layers may merge smoothly with one another to become a continuously graded region of material with the principal direction of grading of material reflection coefficient increasing in the direction away from transducer 5.

FIGS. 2A,B show a cylindrical magnetic aerogel translator (32) with sealed surface, acting as a piston, freely suspended inside a rigid thin tubular member (34) (seen here in section only) by an inflated toroidal pneumatic bearing (33) (seen here in section only), there being wound an electrical coil (31) (seen here in section only) around the outside of the member 34. The translator 32 is magnetised in one of many possible configurations—for example, along the direction of the axis of member 34, and when current passes through the coil 31 the field of the coil interacts with the field of the translator 32 to provide an axial force which drives the translator one way or the other along the axis.

FIGS. 3A,B show an alternative configuration of device similar to that shown in FIGS. 3A,B.

Instead of a toroidal bearing there is a pair of inverted thin-walled elastomer tube sections (300,301) which are unattached to anything except at their ends: inverted tube 300 has its outside end attached to the inside of tubular member 34 (at location 302) and its inside end attached to translator 32 (at location 304), while the other inverted tube 301) is similarly attached at the other end (at locations 303,305 to the tubular member 34 and to the translator 32 respectively). When the translator 32 moves axially relatively to the tubular member 34 the inverted tubes roll inside themselves, allowing nearly free movement of the translator.

The relation between the external diameter of the translator 32, the internal diameter of the tubular member 34 and the natural (unstrained) inside and outside diameters of the two tubes 300,301 is critical, and should be chosen such that in the assembly shown there is a small clearance between the outside of translator 32 and the insides of the tubes 300,301 (except where the latter are attached to the translator 32) and a small clearance between the inside of the tubular member 34 and the outsides of the tubes (again, except where the latter are attached to the member).

FIG. 4 shows a block of transparent, fluorescent aerogel (41), about which are placed a pair of scanning lasers (42,43) emitting narrow parallel beams of light (46,47) which are deflectable by means of controllable optical beam deflectors (44,45). The beams 46,47 pass into, and scan through, the aerogel block 41.

The beam intensities or energies are individually insufficient to cause the aerogel to fluoresce. However, where the beams intersect, as at the point (48) shown, their effect is sufficient to cause visible fluorescence in the aerogel. The colour of the fluorescence is controllable by modification of the laser beam wavelength, and/or intensity, and our pulse duration if pulsed.

By appropriate deflection of the beams every position within the aerogel monolith can be separately caused to fluoresce, and thus a 3D display device is created.

A variant of this system, not shown here, uses a similar block of transparent, fluorescent aerogel adjacent to which is placed a single scanning laser the beam of which is highly convergent and controllably focusable, such that the point of focus, where the energy density is highest, may be positioned anywhere within the aerogel block. The focus, beam and energy density are arranged such that only very close to the point of focus is the energy density adequate to cause substantial fluorescence in the aerogel. Thus, by controlling the position of the beam and its focal point, a visual image can be built up in the aerogel block.

FIG. 5 shows a helical flat-wound bender of some suitable diameter, thickness, pitch and width (shown respectively at 58, 57, 59 and 56).

The bender is comprised of a top (a viewed) layer (54) and a bottom (as viewed) layer (55) bonded together at their interface (50). If both layers 54,55 are piezoelectric then the bender is a bimorph; if only one layer is piezoelectric then it is a unimorph.

The helix extends or contracts along the direction of the axis (shown as dashed line 51) depending on the polarity of the electrical drive voltage applied between conductive electrodes (not shown) deposited one on the top (as viewed) face of the top layer 54 and one on the bottom (as viewed) face of the bottom layer 55. To allow easy application of load forces, the top and bottom turns of the helix may be flattened out somewhat as indicated in the Figure, or they may be ground flat.

FIGS. 6A,6B show simple bimorph "benders", one "helical" (like that of FIG. 5) and one "linear", to each of which has been added a sensing layer.

FIG. 6B shows a simple bimorph bender of conventional type, wherein two layers of piezoelectric material (61,62) are bonded together, with an optical electrode (64) between them, and electrodes (65,66) attached such that a drive voltage may be applied to the opposing faces of the structure so formed. An additional layer (63) of piezoelectric material is the sensor layer; it plays no part in the bender deflection process when layers 61,62 are driven (other than to impede it somewhat by virtue of its finite compliance). An additional electrode (67) is arranged on that face of sensor layer 63 not bonded to layer 62, in order to provide a signal output from this sensor layer when deflected by the bender action of layers 61,62.

In the device as shown, the sensing layer 63 shares a common electrode (66) with the two main layers 61,62. In applications where this electrode sharing is undesirable, it is possible to replace the single electrode 66 with a pair of electrodes insulated from each other by a thin intervening layer, one of which provides connection to the bender proper layer 62 and one of which provides connection only to the sensing layer 63. However, it will often be adequate to use electrode 66 as a common ground for driving and sensing connections with little interference then generated in the sensing circuit by the driving circuit, provided care is taken to ensure that electrode 66 is adequately conductive.

In FIG. 6A there is shown a helical bender much like that of FIG. 5, with two electrically-driven piezoelectric layers (609, 610: the electrodes are not shown), but with the addition of a further piezoelectric laminate layer (608). This additional layer plays no active role in deflecting the structure, but is used instead to provide a feedback signal to sensing electronics (not shown) about the actual deflection of the bender when in use. The added "passive" sensor layer 608 also has surface electrodes (not shown), one of which may be shared with the active layer 609 if desired, as described above for the simple bender case.

In use, a voltage is driven between the top (as viewed) of active layer 609 and the bottom of active layer 610, which layers have been previously poled in an opposite sense to each other. This causes the ribbon-like structure (which has been edge-, or flat-, wound into a helix) to bend, and this deflection causes the helix as a whole to lengthen or shorten defending on the sign of the drive voltage. The sensing layer 608, being securely bonded to (or fired onto) active layer 609 is also deflected by this bender activity, and in so being, and because it is itself piezoelectric, produces a voltage signal between its surfaces which may be used as a feed back signal connected via its surface electrodes (not shown).

FIGS. 7A,B are in many respects very like FIGS. 6A,B.

The simple bimorph bender of FIG. 7B is of a generally conventional type wherein two layers of piezoelectric material (71,72) are bonded together, with an optional electrode (74) between them, and electrodes (75,76) attached such that a drive voltage may be applied to the opposing faces of the structure so formed. Also shown in FIG. 7B is an additional layer of piezo-resistive material (73) which plays no part in the bender deflection process when layers 71,72 are driven (other than to impede it somewhat by virtue of its finite compliance), which layer 73 is bonded to electrode (layer) 76 with an intervening insulating layer (not shown) to electrically isolate it therefrom. Additional electrodes (77, 78) are arranged on that face of layer 73 not bonded to layer 72 (via the insulating layer and electrode 76), one on each end of the piezo-resistive material of the layer 73, in order to provide a signal output from this layer when deflected by the bender action of layers 71,72.

FIG. 7A shows a helical bender much like that of FIG. 5, and with two electrically-driven piezoelectric layers (709, 710: the associated electrodes are not shown), save that it includes a further piezo-active laminate layer (708: in this embodiment this further piezo-active layer 708 is piezo-resistive, unlike the case of the FIG. 7A embodiment, where the sensing layer is piezo-electric). This extra layer plays no active role in deflecting the structure, but is used instead to provide a feedback signal (to sensing electronics, not shown) about the actual deflection of the bender when in use. The sensing layer 708 is bonded to active layer 709 and its electrode via an intervening insulating layer (not shown) so as electrically to isolate the sensing layer 708 from the active layer. The sensing layer 708 also has electrodes (again, not shown), one at each end of the helical structure, for connection to the sensing circuitry.

In use, a voltage is driven between the top (as viewed) of active layer 709 and the bottom of active layer 710, which layers have been previously poled in an opposite sense to each other. This causes the ribbon-like structure (which has been edge-, or flat-, wound into a helix) to bend, and this deflection causes the helix as a whole to lengthen or shorten depending on the sign of the drive voltage. The piezo-resistive sensing layer 708, being securely bonded to or fired onto active layer 709, is also deflected by this bender activity, and in so doing, and being piezo-resistive, produces a resistance change along its length which may be converted to a voltage signal by the passage of a current through it (via its electrodes, which signal may be used as a feed back signal to sense and/or control the deflection of the helical bender.

FIG. 8 shows a typical driver circuit incorporating a "bender" with piezo-resistive sensor layer feedback.

In the Figure there is shown a differential operational amplifier (816) is used in a classic negative-feedback circuit to drive a bender (815), from an input demand signal (fed in at input 818) which is connected to the inverting input of the amplifier 816 via a resistor (817). In one version of this circuit, resistor 813 represents the piezoresistive sensing layer integrated with the bender 815, and a current is made to pass through this resistor from a DC voltage supply (819) via a resistor (811). A voltage therefore appears across resistor 813 proportional to its resistance, and therefore with a component proportional to the strain experienced by the sensing layer resistor 813. The voltage at the junction of the resistors 811,813 is connected to the inverting input of the amplifier 816 as a negative-feedback signal. A further pair of resistors (812,814) are used to produce an offset voltage the same value as the voltage at the junction of the resistors 811,813 when the bender and sensing resistor are in the unstrained or undeflected state. This offset voltage is connected to the non-inverting input of the amplifier 816.

In operation, when the input voltage 818 is set to some demand value within the range of operation of the circuit, the output of the amplifier 816 drives the bender to an operating point which causes strain in the sensing layer piezoresistor 813 and changes its value. This modifies the voltage at the junction of resistors 811,813, which in turn modifies the differential input voltage applied to the amplifier 816. If the sense of the resistance change is correctly chosen with respect to the drive voltage applied to the bender 815 (i.e. the polarity of the connection to the bender is such as to ensure that negative- and not positive-feedback is achieved), the circuit rapidly settles to a point where the drive to the bender 815 is just such as to produce a deflection or strain proportional to the input voltage 818.

An improved version of the arrangement shown in FIG. 8 may be constructed as follows.

In this arrangement, both resistors 813,814 represent piezoresistive sensing layers integrated with the bender 815. They may, for example, be placed one either side of the bender, but are in any case arranged such that one sensing layer experiences compression whilst the other experiences extension, and vice versa, of approximately equal magnitudes. In such an arrangement, both piezoresistive sensing layers will experience very similar magnitude strains (but of opposite signs) during operation of the bender, and both will be subject to similar temperature variations due both to environmental temperature changes and to changes in bender temperature caused for example by the drive power applied to it. In the circuit of FIG. 8 they are then connected such that their resistance changes provide feedback voltage of opposite polarities to the two separate input terminals of the amplifier 816. In this way their sensing signals add together to provide increased negative feedback. However, any changes in their resistance—due to common temperature variations, or due to long term ageing of the material—will tend to balance, and so produce approximately zero feedback voltage. In this way a highly temperature compensated integrated actuator/sensor and control circuit may be achieved.

In a further slight variation on the last described circuit and device configuration, the resistors 813, 812 (and not 814) are both piezoresistive layers, and may be bonded on to the one and same side of the bender, each occupying roughly half the width of the bender and each running the full length of the bender and thus experienced essentially the whole bender strain, but being electrically isolated from one another. In this configuration, strain in the bender 815 results in similar magnitude and sign of piezoresistive changes in the two sensing resistors 813,812. Their location in the circuit of FIG. 8 results in their strain-related resistance signals being additive, and causing negative feedback.

FIG. 9 shows a section through a simple piezoelectric ink-jet print head device according to the invention (it is to be imagined that a long strip of channelled body has been extruded, and has then been cut transversely into usable lengths; the Figures shows one of the faces produced by such a transverse cut).

The print-head has a piezoelectric body portion (911) within which are a number of channels (as 912) defined by wall portions, and on the channel-facing surfaces of these are conductive layers (as 913). In operation, ink is fed into each channel 911 via ports (not shown: they would be in a blanking plate sealed over the cut face), and when a drive signal is applied to the electrodes 913 lining any particular channel 912 the walls flex, pumping some of the ink therein out through very fine apertures (not shown: they would be in another blanking plate sealing off the other end—also not shown—of the cut length).

What is claimed is:

1. An aerogel, suitable for use as an absorber of sound energy, which is constructed as a conglomerate of particles with the packing of these particles being such that there are spaces left therebetween to allow the passage of sound.

2. An aerogel as claimed in claim 1, wherein the particles are from 0.5 mm to 20 mm across.

3. The aerogel as claimed in claim 1, wherein the particle shapes are selected from the group consisting of spheres, cylinders, and irregular particle sizes as are produced by crushing particles or monoliths.

4. An aerogel as claimed in claim 1, wherein the structure is stabilized by bonding the particles together with an adhesive.

5. A layered structure, suitable for use as an absorber of sound energy, comprised of multiple layers of aerogels of graded values of acoustic reflection and absorption properties, or comprised of aerogel material of continuously varying values of acoustic reflection and absorption properties throughout the thickness of the absorbing structure, in the principal direction of sound from the source.

6. A layered structure as claimed in claim 5, which is successive layers of material overlaid onto a supportive substrate that is substantially acoustically transparent over the frequency range of interest.

7. A layered structure as claimed in claim 5, wherein materials other than aerogels form one or more additional layers further away from the sound source.

8. A layered structure as claimed in claim 5, which is pre-filled with a gas with acoustic properties differing from those of air.

9. A layered structure as claimed in claim 5, which is an areogel suitable for use as an absorber of sound energy, which is constructed as a conglomerate of particles with the packing of these particles being such that there are spaces left therebetween to allow the passage of sound.

10. A layered structure as claimed in claim 5, wherein the aerogel is overlaid onto a supportive substrate.

11. A layered structure as claimed in claim 5 being pre-filled with a gas with acoustic properties differing from those of air.

12. A layered structure as claimed in claim 5, wherein the aerogel particles are from 0.5 mm to 20 mm across.

13. An absorber of sound energy comprising at least one layer of aerogel, said absorber having a sound reflection coefficient at the input side interface which sound reflection coefficient is smaller than 0.2 over the frequency range of interest.

14. The absorber of claim 13, wherein the reflection coefficient is smaller than 0.2 in the 20 Hz to 20 KHz band.

15. The absorber of claim 13, wherein the reflection coefficient is smaller than 0.2 in the 20 Hz to 400 Hz band.

16. The absorber of claim 13, wherein the reflection coefficient is smaller than 0.2 at a sound frequency of 30 Hz.

17. The absorber of claim 13, having a layer of aerogel at the input side interface, said layer being constructed as a conglomerate of particles with the packing of these particles being such that there are spaces left therebetween to allow the passage of sound.

18. The absorber of claim 17, wherein the aerogel particles are from 0.5 mm to 20 mm across.

19. The absorber of claim 17, wherein the layer comprises adhesive binder material.

20. The absorber of claim 13 having a layer of aerogel at the input side interface, said layer being constructed as a conglomerate of particles with the packing of these particles being such that there are spaces left therebetween to allow the passage of sound.

21. The absorber of claim 13 having at least a second layer positioned further away from a sound source and having a higher sound absorption coefficient than the layer at the input side interface.

22. The absorber of claim 21, wherein the at least second layer is formed of areogel.

23. The absorber of claim 21, wherein the at least second layer is formed of non-aerogel material.

24. The absorber of claim 13 having a supportive substrate that is substantially acoustically transparent.

25. A layered structure, suitable for the use as a sound absorber, comprising multiple layers of areogel of graded or continuously varying values of acoustic reflection and absorption properties throughout the thickness of the absorbing structure in the principal direction of the sound from a source, wherein the layers of aerogel are constructed as a conglomerate of aerogel particles with the packing of these particles being such that there are left gas-filled spaces therebetween to allow the passage of sound.

26. The layered structure of claim 25, wherein the particles are from 0.5 mm to 20 mm across.

27. The layered structure of claim 25, wherein the shapes of the particles are selected from a group consisting of spheres, cylinders, and irregular particle shapes as are produced by crushing either larger particles or monolithic aerogel.

28. The layered structure of claim 25, being stabilized by bonding the particle together with an adhesive.

29. The layered structure of claim 25, being overlaid onto a supportive substrate that is substantially acoustically transparent over a frequency range of interest.

30. The layered structure of claim 29, wherein the frequency range of interest is the 20 Hz to 20 KHz band.

31. The layered structure of claim 25 having at least one layer of aerogel with a reflection coefficient smaller than 0.2 in the 20 Hz to 20 KHz band.

32. The layered structure of claim 25 having at least one layer of aerogel with a reflection coefficient smaller than 0.2 in the 20 Hz to 400 Hz band.

33. The layered structure of claim 25 having at least one layer of aerogel with a reflection coefficient smaller than 0.2 at a sound frequency of 30 Hz.

34. The layered structure of claim 25, wherein the gas-filled spaces are filled with a gas with acoustic properties differing from those of air.

35. The layered structure of claim 25, wherein materials other than aerogel form one or more additional layers further away from the sound source.

* * * * *